US008519489B2

(12) United States Patent
Thalappil et al.

(10) Patent No.: US 8,519,489 B2
(45) Date of Patent: Aug. 27, 2013

(54) METHOD AND APPARATUS FOR TUNABLE ELECTRICAL CONDUCTIVITY

(75) Inventors: Pradeep Thalappil, Tamilnadu (IN); Chandramouli Subramaniam, Tamilnadu (IN)

(73) Assignee: Indian Institute of Technology Madras, Chennai (IN)

( * ) Notice: Subject to any disclaimer, the term of this patent is extended or adjusted under 35 U.S.C. 154(b) by 684 days.

(21) Appl. No.: 12/638,167

(22) Filed: Dec. 15, 2009

(65) Prior Publication Data

US 2011/0049647 A1 Mar. 3, 2011

(30) Foreign Application Priority Data

Aug. 26, 2009 (IN) ........................... 2053/CHE/2009

(51) Int. Cl.
*H01L 27/14* (2006.01)
*H01L 21/44* (2006.01)

(52) U.S. Cl.
USPC ................... 257/414; 252/503; 257/E21.294; 257/E29.166; 438/680; 977/742; 977/750; 977/773

(58) Field of Classification Search
USPC .................. 204/400; 257/E21.294, E29.166, 257/414, 503, 511; 438/680; 527/532; 252/503; 977/742, 750, 773
See application file for complete search history.

(56) References Cited

U.S. PATENT DOCUMENTS

2005/0189524 A1 9/2005 Weng et al.
2006/0014638 A1* 1/2006 Iwamura ....................... 502/417
2008/0142361 A1 6/2008 Han et al.

FOREIGN PATENT DOCUMENTS

WO WO 2006/024023 A2 3/2006
WO WO 2009/104202 A1 8/2009

OTHER PUBLICATIONS

Chandramouli Subramaniam, T. S. Sreeprasad, and T. Pradeep, G.V. Pavan Kumar and Chandrabhas Narayana,T. Yajima, Y. Sugawara, Hirofumi Tanaka, and Takuji Ogawa, J. Chakrabarti, Visible Fluorescence Induced by the Metal Semiconductor Transistion in Composites of Carbon Nanotubes with Noble Metal Nanoparticle,PRL 99, 167404 (2007),© 2007.*

Stan et al., Uptake of Gases in Bundles of Carbon Nanotubes, Physical Review B (Condensed Matter and Materials Physics), Jul. 15, 2000, vol. 62, Issue 3, pp. 1-28.

Maeda et al., Large-Scale Separation of Metallic and Semiconducting Single-Walled Carbon Nanotubes, Journal of American Chemical Society, 2005, vol. 127, No. 29, pp. 10287-10290.

Barone et al., Near-Infrared Optical Sensors Based on Single-Walled Carbon Nanotubes, Nature Materials, Jan. 2005, vol. 4, pp. 86-92.

(Continued)

*Primary Examiner* — Bijan Ahvazi
(74) *Attorney, Agent, or Firm* — Knobbe, Martens, Olson & Bear, LLP

(57) ABSTRACT

An embodiment relates a method comprising creating a reversible change in an electrical property by adsorption of a gas by a composition, wherein the composition comprises a noble metal-containing nanoparticle and a single walled carbon nanotube. Another embodiment relates to a method comprising forming a composition comprising a noble metal-containing nanoparticle and a single walled carbon nanotube and forming a device containing the said composition. Yet another method relates to a device comprising a composition comprising a noble metal-containing nanoparticle and a single walled carbon nanotube on a silicon wafer, wherein the composition exhibits a reversible change in an electrical property by adsorption of a gas by the composition.

20 Claims, 3 Drawing Sheets

(56) References Cited

OTHER PUBLICATIONS

Collins et al., Engineering Carbon Nanotubes and Nanotube Circuits Using Electrical Breakdown, Science, Apr. 27, 2001, vol. 292, pp. 706-709.
Subramaniam et al., Visible Fluorescence Induced by the Metal Semiconductor Transition in Composites of Carbon Nanotubes with Noble Metal Nanoparticles, Physical Review Letters, Oct. 19, 2007 vol. 99, pp. 167404-1 to 167404-4.
Wan et al., Fabrication and Ethanol Sensing Characteristics of ZnO Nanowire Gas Sensors, Applied Physics Letters, May 3, 2004, vol. 84, No. 18, pp. 3654-3656.
Valentini et al., Sensors for sub-ppm NO2 Gas Detection Based on Carbon Nanotube Thin Films, Applied Physics Letters, Feb. 10, 2003, vol. 82, No. 6, pp. 961-963.
International Search Report and Written Opinion, mailed Mar. 18, 2011, for International Application No. PCT/IB2010/002036, filed Aug. 17, 2010.

* cited by examiner

METHOD AND APPARATUS FOR TUNABLE ELECTRICAL CONDUCTIVITY

CROSS-REFERENCE TO RELATED APPLICATIONS

The present application claims the benefit of Indian Patent Application No. 2053/CHE/2009, filed Aug. 26, 2009, which is hereby incorporated by reference in its entirety.

BACKGROUND

Carbon nanotubes (CNTs) have been envisaged to have tremendous applications in the fields of sensors, medical diagnostics and therapeutics, chemical process control industry, nano-electronics, and nanoscale devices. In general, single-walled nanotubes (SWNTs) have been classified into metallic (m) and semiconducting (s) types, based on their chirality and n, m indices. Present methods of synthesis produce a mixture of metallic single walled carbon nanotubes (mSWNTs) and semiconducting single walled carbon nanotubes (sSWNTs), which in their native state self organize to form bundles of nanotubes of native SWNTs. However, for fabrication of a nanoelectronics device, it is essential to have only one type of SWNTs-either metallic or semiconducting type. From the native SWNTs (which always contain a mixture of mSWNTs and sSWNTs), it is impossible to make a semiconducting bundle of nanotubes. Selective destruction of mSWNTs in bundles of nanotubes makes fabrication of field effect transistors (FETs) with remaining sSWNTs possible.

Subramaniam C, et al. (2007), in "Visible fluorescence induced by the metal semiconductor transition in composites of carbon nanotubes with noble metal nanoparticles," *Phys. Rev. Lett.* 99:167404-167407, states, "We show that single-walled carbon nanotube (SWNT) bundles emit fluorescence in the presence of noble metal nanoparticles and nanorods in the solid state. Conductivity measurements with metallic nanotubes, isolated from pristine SWNTs, show that they become semiconducting in the presence of metal nanoparticles." It is, however, desirable to create a mSWNT-noble metal nanoparticle composite that exhibits semiconducting properties such that the composite reverts to metallic state reversibly.

SUMMARY

The embodiments relate to the field of nanoelectronics, particularly to tuning the electrical conductivity of single walled carbon nanotube bundles and the fabrication of switching devices. The embodiments herein relate to a method comprising creating a reversible change in an electrical property by adsorption of a gas by a composition, wherein the composition comprises a noble metal-containing nanoparticle and a single walled carbon nanotube. Preferably, the single walled carbon nanotube comprises a pristine single walled carbon nanotube and/or a metallic single walled carbon nanotube. Preferably, the noble metal-containing nanoparticle comprises silver and/or gold. Preferably, the composition comprises interstitial channels that permit the gas to pass in and out of the composition. Preferably, creating the reversible change in an electrical property by adsorption of a gas by the composition occurs at a single nanotube level such that the reversible change can be measured by a change in conductivity, fluorescence or Raman spectra of a bundle of the single walled carbon nanotubes. Preferably, the electrical property of the composition is tunable such that the electrical property is alterable in a controlled manner. Preferably, the reversible change in the electrical property occurs from a semiconducting property to a metallic conducting property.

Another embodiment relates to a method comprising forming a composition comprising a noble metal-containing nanoparticle and a single walled carbon nanotube and forming a device containing said composition. The composition exhibits a reversible change in an electrical property by adsorption of a gas by the composition. The method could further comprise of single walled carbon nanotube with the noble metal-containing nanoparticle at a liquid-liquid interface. Preferably, prior to combining the single walled carbon nanotube with the noble metal-containing nanoparticle at the liquid-liquid interface, a majority of the single walled carbon nanotube resides on one side the liquid-liquid interface and a majority of the noble metal-containing nanoparticle resides on another side of the liquid-liquid interface. The method could further comprise fabricating a device comprising the composition. Preferably, the fabricating method comprises placing the composition on a silicon wafer and vapor depositing a metal on the silicon wafer. The method could further comprise placing the device in a sealed chamber, creating a vacuum in the sealed chamber, and introducing a gas in the sealed chamber.

Another embodiment relates to a device comprising a composition comprising a noble metal-containing nanoparticle and a single walled carbon nanotube on a silicon wafer, wherein the composition exhibits a reversible change in an electrical property by adsorption of a gas by the composition. The device could further comprise electrodes on which the composition is placed. The device could be a sensor, a medical diagnostics device, a medical therapeutics device, a chemical process control device, a nano-electronics device, a nano-electromechanical device and combinations thereof. The device could be tunable such that the electrical property of the composition is alterable in a controlled manner.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

The term nanoparticle refers to a particle for which one of the structural parameters is within 1-100 nm. It can be a sphere, rod, wire, triangle or any other shape. One of the components of the nanoparticle could be a noble metal.

The term tunable means that the conductivity can change continuously. For example, as seen from the fluorescence traces (in FIG. 2A), the intensity is varying continuously upon exposure of gases. It may be inferred from other measurements that reversible change of fluorescence means reversible change of conductivity.

An embodiment relates to a mSWNT-noble metal nanoparticle composite, exhibiting semiconducting properties, that reverts to metallic state reversibly by adsorption of specific gases in the interstitial channels (ICs). The embodiments relate to a tunable and reversible electrically conducting SWNT-noble metal composite that behaves both as a metal and as a semiconductor. Precise measurements using confocal Raman microscopy and point-contact current-imaging atomic force microscopy (PCI-AFM) confirm this reversible transformation. Yet another embodiment relates to a nanometer scale switching device having tunable and reversible electrically conducting SWNT-noble metal composite. Such a switching device could be used in nanoelectronics. The property of the reversible electrical conductivity of the SWNT composite was used for fabricating the switching device functioning at nanometer scale.

In one embodiment, the SWNT composite could adsorb gases depending on the size of the gas and the strengths of the adsorbate-adsorbate, adsorbent-adsorbent and adsorbate-adsorbent interactions. Adsorbate is the species which adsorbs. The material on which adsorbate adsorbs is called the adsorbent. The strength of the interaction between the adsorbate and the adsorbent decides whether an adsorbate would adsorb or not.

The gas can be a vapor such as hexane or acetone or ethanol. Exposure can be high or low pressures. The device can work in air or in any other ambience, not necessarily in vacuum. Electrical change can be reflected in a signal such as light emission, Raman spectrum, or any other spectroscopic or microscopic property. The substrate for device fabrication can be glass, conducting glass, plastic, polymer, or any other suitable substrate on which the composite can be created.

Figure 1:
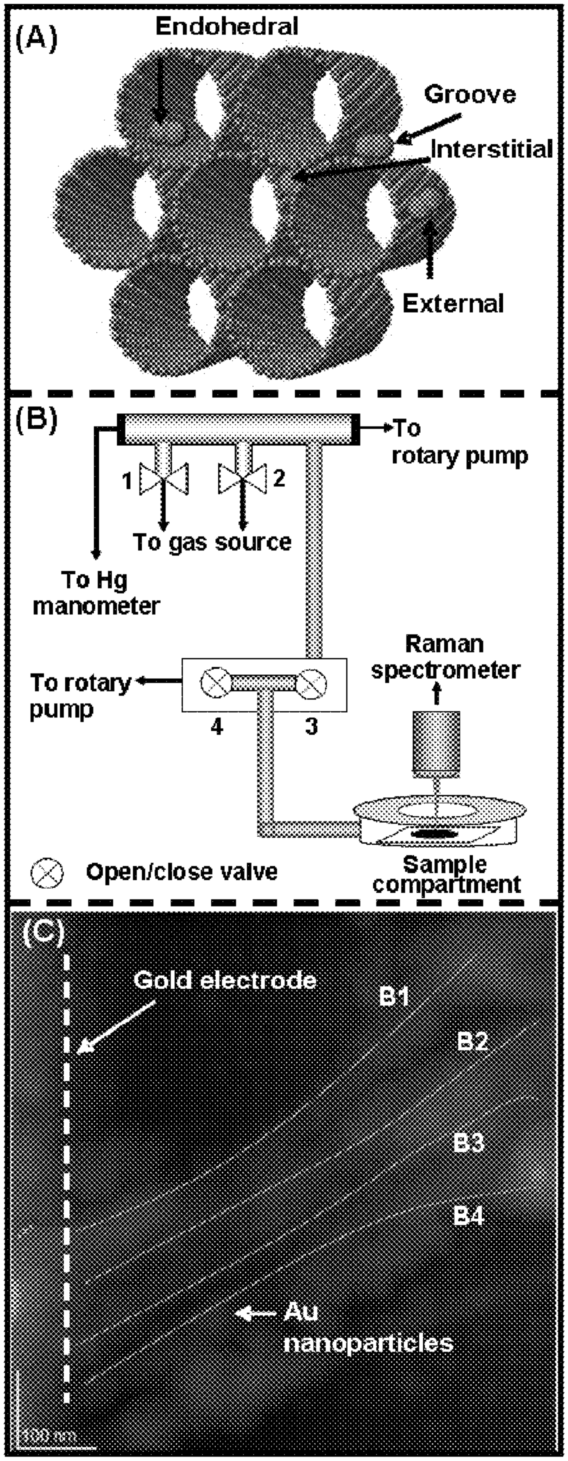
FIG. 1 (A) shows different adsorption sites in a carbon nanotube bundle of a SWNT composite. (B) A schematic diagram of a microRaman setup used for gas-exposure studies. (C) Atomic force microscopy (AFM) topographic images of Au-mSWNT composite. Several points on various bundles marked B1 to B4 were analyzed though PCI-AFM. The gold electrode and the bundles are marked with guide lines.

Different adsorption sites in a carbon nanotube bundle of the SWNT composite are shown schematically in FIG. 1A. For example, hydrogen and helium get adsorbed in both the interstitial (IC) and the endohedral (interior pores of the nanotube) spaces in the bundles of nanotubes, while nitrogen is generally adsorbed in the endohedral spaces. Argon can generally be adsorbed on the exterior surface of the bundles of nanotubes, through weak van der Waals (vdW) interactions.

In one embodiment, the interstitial gases, like hydrogen, tend to screen the interaction between two adjacent SWNTs in a bundle of nanotubes, leading to the suppression of the defect states in the nanotube-nanoparticle composite. Another embodiment relates to verification by point contact current imaging-atomic force microscopy (PCI-AFM) measurements that the elimination of the defect states enable manipulation of the electrical conductivity of the SWNT composite by exposing the composite to specific gases. For example, a semiconducting Au-mSWNT composite returns reversibly to the original metallic state. Thus, one embodiment relates to a methodology that enables one to have bundles of nanotubes with uniform and tunable electrical property. In particular, the mSWNTs of the parent mixed bundle of nanotubes could be reversibly converted to sSWNTs. The tunable electrical property could be used to create an electrical switch operating at nanometer scales.

Without being restricted to any specific phenomenon for the tunable electrical property of the SWNT composite, the inventors provide a model to show how the interaction between two nanotubes could be mediated via the interstitial gas atoms. If the interstitial particle (~a few angstroms) is much smaller than the nanotube diameter (several nanometers), the system can be approximated by particles confined between two infinite graphene sheets, the effect due to curvature being insignificant. Let the interaction between the carbon atoms in the graphene sheet and a particle in its vicinity be of the vdW type. The interaction between an infinite graphene sheet and the particle at a distance z, on integration over the lateral dimensions due to symmetry, is given by $$V(z) = 8\pi\varepsilon[(\sigma/z)^{10} - (\sigma/z)^4]$$

where $\epsilon$ is the interaction strength, and $\sigma$ the length scale of interaction. The interaction has a minimum energy $$V_{min} = -12\pi\varepsilon\sigma^2/10$$

at $z=\sigma$ distance away from the wall where the interstitial gas particles would prefer to be located. However, the gas particles may fluctuate in position around the minimum. In the gaseous phase of the interstitial particles, the equilibrium density profile of the adsorbed particles $$\rho(z) = \exp\left[-\beta(V_{min} + \frac{V''}{2}(z - H + \sigma)^2\right],$$

where V" is the curvature at the minimum, H is the position of the wall and $\beta$ is defined as:

$$\beta = 1/k_B T,$$

where kB being the Boltzmann constant and T the absolute temperature. The force between the walls mediated by the adsorbed particles, given by $$\frac{-\partial}{\partial H}\int_{-\infty}^{H}\left(\frac{V''}{2}(z-H+\sigma)^2\right)\rho(z),$$

is predominantly repulsive ~$\epsilon^{1/4}\exp[-\sqrt{6\pi\beta\epsilon}(H-2\sigma)]$. Thus the adsorbed particles would tend to repel the wall, the repulsion being damped with a length scale of $$l_c/\sigma = 2 + 1\Big/\sqrt{6\pi\beta\varepsilon}.$$

If two walls are separated by a distance comparable to $l_C$ with the adsorbed particles between them, the direct vdW interaction between the walls would be screened due to the repulsion mediated via the adsorbed particles. Similarly, for the interaction between the nanoparticle and nanotube surface, namely, the nanoparticle-nanotube interactions would get reduced due to the gas particles in the wedge between the two surfaces. Thus the overall effect of the nanoparticle binding on the exterior surface of a bundle of nanotubes would be reduced due to the presence of interstitial gas particles.

EXAMPLES

The materials were synthesized as follows. A nanoparticle-nanotube composite was prepared at a liquid-liquid interface. Gold and silver spherical nanoparticles (15 and 60 nm diameter, respectively) were prepared using citrate reduction. Smaller gold nanoparticles of 4 nm mean diameter were prepared by reducing auric (AuCl-4) ions using sodium borohydride at 0° C. Photochemically and chemically synthesized gold nanorods (AuNRs) of aspect ratios 2.8 and 3.1, respectively (15 and 12 nm diameter, respectively), could also be used. AuNRs, preserved in a saturated solution of cetyltrimethylammonium bromide (CTAB), were cleaned by repeated sonication and centrifugation at 12,000 g. The final dispersion did not contain the protecting agent CTAB and was found to aggregate and precipitate within 10 minutes of redispersion. The as-prepared nanoparticles or the purified nanorods were used in the composite preparation.

SWNTs from various sources, namely, Sigma Aldrich, Carbon Nanotechnologies, Inc., and those synthesized from alcohols were used to verify the reproducibility of the results. Their average length was approximately 20 μm as reported by the suppliers, although smaller lengths were detected in microscopy. SWNTs were dispersed in N; N-dimethyl formamide (DMF). Repeated sonication and centrifugation (at 50,000 g) for prolonged periods ensured that only SWNTs were present. Purified dispersion, without any surfactant, was stable for extended periods. No metallic impurities or nanoparticles were detected in the purified material. SWNTs prepared via high-pressure CO (HiPCo) disproportionation route, purchased from Carbon Nanotechnologies, Inc. were used for all measurements with metallic SWNTs (mSWNTs).

Equal volumes of aqueous metal nanoparticles or nanorods (concentration, CNP~10-4 M) and diethyl ether were mixed to create an aqueous-organic interface. Purified SWNT dispersion in DMF (concentration, CSWNT~1:7 mg/ml) was added to this biphasic system, resulting in spontaneous formation of a composite film at the aqueous-organic liquid interface. This composite was transferred to a desired substrate, after evaporation of the organic layer, for further investigations.

Metallic nanotubes were extracted from the HiPCo synthesized SWNTs. The purity of mSWNTs in the extracted sample was estimated to be ~88%. Composites of pristine SWNTs and mSWNTs were formed with gold (Au-SWNT and Au-mSWNT, respectively) and silver (Ag-SWNT and Ag-mSWNT, respectively) nanoparticles at the liquid-liquid interface.

A schematic diagram of the microRaman setup used for these studies is shown in FIG. 1B. The set-up consisted of a gas line connected to the sample stage of the WiTec confocal Raman microscope, which used 514.5 nm Ar ion laser for excitation. Confocal Raman measurements were done with a WiTec GmbH, Alpha-SNOM CRM 200 having 514.5 nm argon ion laser with a 100× objective. The signal was collected in a backscattering geometry. A Peltier-cooled charge coupled device was used as the detector.

The gas line was connected to a mercury manometer using which the pressure was monitored and controlled. The desired gas cylinder(s) was connected to the gas line through valves 1 or 2 and a known amount of gas was admitted inside the sample stage through a tri junction valve 3. The stage was a part of the confocal Raman microscope. Yet another valve 4 connected the gas line to the rotary pump so that the gases could be removed. The sample stage was also connected to a separate rotary pump in order to take the composite to a vacuum of 10-2 torr. The Raman spectrum from the composite was recorded after evacuating the sample compartment. The laser intensities were kept constant throughout the experiment. A shutter was used to cut-off the laser falling on the sample while data were not collected, to avoid possible laser-induced transformations to the sample. In an experiment, first valves 3 and 4 were closed. The desired gas was then leaked into the gas line by opening valve 1 or 2. The amount of gas leaked into the gas line was monitored using the mercury manometer. After admitting the gas, valve 1 was closed. Valve 3 was then opened carefully with simultaneous monitoring of the pressure inside the gas line using the mercury manometer. Thus a controlled amount of gas was leaked into the sample compartment. The Raman spectrum from the sample was measured after exposing the gas to the composite for 5 minutes so that the response of the system equilibrated. The gas pressure inside the sample compartment was varied systematically from 10 to 500 torr with its fluorescence being monitored simultaneously. The experimental geometry in the present set-up did not allow us to go beyond atmospheric pressure.

The Au-mSWNT sample was taken in the glass housing of the PCI-AFM chamber, which was evacuated using a rotary pump. The desired gas (H2 or N2) was then leaked into the sample compartment and equilibrated for 15 minutes before the measurement. A suitable area for the PCI-AFM measurement was selected by performing a large area scan and then narrowing down to the desired region. FIG. 1C shows the topographic AFM image of the sample obtained in the PCI-AFM setup showing an Au-mSWNT composite with several bundles of nanotubes marked B1, B2, B3 and B4. A bias voltage was applied between the conductive Ti—Pt cantilever and the gold electrode with the I-V characteristics measured at various points along the long axis of the nanotube composite. Separate PCI-AFM measurements were conducted with the composite in the presence of nitrogen and hydrogen, respectively. It is to be noted that the PCI-AFM mapping of the same area of the composite was carried out in the presence of the gases. This allows for direct comparison of the I-V characteristics and tracking the associated transformations. Repeated measurements on various bundles of nanotubes seen in an AFM image (marked in FIG. 1C) have been performed.

Figure 2:
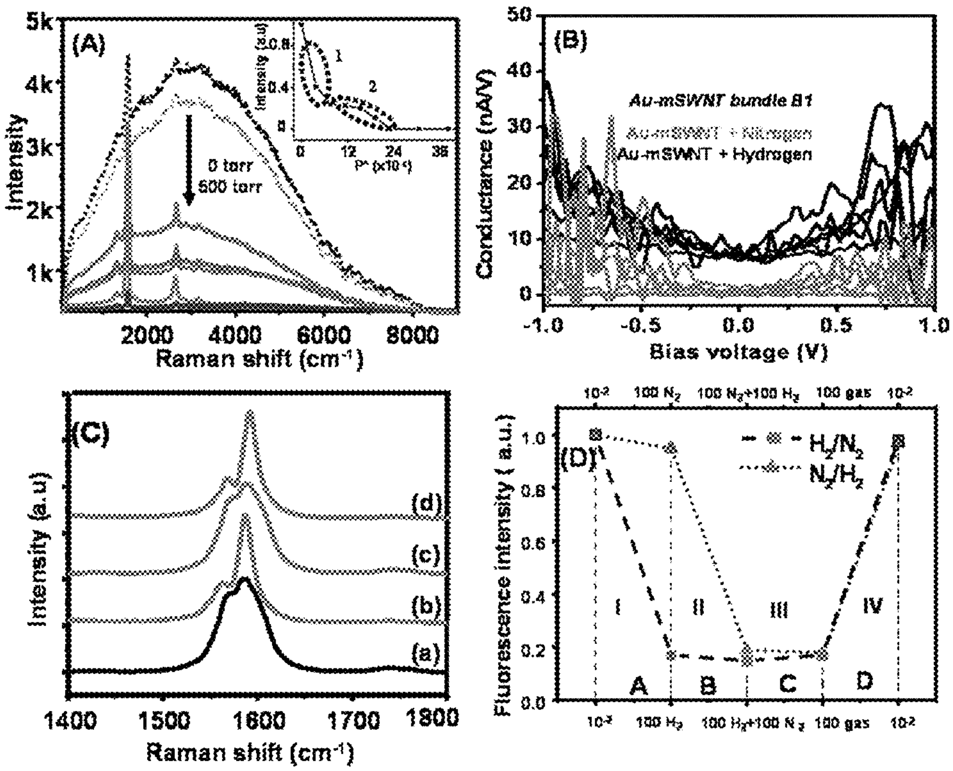
FIG. 2 (A) The Raman spectral variation with increasing pressure of $H_2$ for a few experiments at which specific pressures were exposed. Dotted black trace is in vacuum. Dotted grey trace shows the recovery spectrum upon immediate pumping. Complete recovery is obtained upon pumping for 15 minutes. Inset: Plot of normalised fluorescence intensity versus P* for Au-mSWNT. The two regions having different slopes are circled in black and marked as 1 (interstitial adsorption) and 2(external adsorption). (B) Plot of conductance versus bias voltage constructed from various points of the bundle labeled B1 in FIG. 1B, under an atmosphere of nitrogen (gray traces) and hydrogen (black traces). (C) Raman spectra of (a) purified mSWNTs, (b) Au-mSWNT composite, (c) Au-mSWNT upon exposure to 500 torr $H_2$ and (d) Au-mSWNT composite after pumping out $H_2$ exposed in (c). Spectra (a) to (d) are recorded at the same point on the composite sample. (D) Variation of fluorescence intensity upon exposing mixture of gases. Regions A to D are explained in the text. Pressures are in torr.

The variation of the fluorescence intensity of Au-mSWNT composite on exposure to hydrogen at different pressures is shown in FIG. 2A. The fluorescence intensity without hydrogen (0 torr) is shown by the topmost spectrum. However, consider the lowermost spectrum, measured at a pressure of 500 torr of hydrogen. The spectrum resembles that of pristine mSWNTs, due to complete quenching of the fluorescence. The positions of the Raman bands (radial breathing mode or RBM, D, G and G' bands), were not shifted during gas adsorption, but their intensities were reduced. In particular, the reduction in the D-band intensity indicates that the defect states in the original Au-mSWNT composite were reduced on admitting hydrogen in the bundle of nanotubes, which is expected according to our theoretical analysis. RBM, D, G and G' are specific Raman modes observable in SWNTs. RBM corresponds to a vibration in which the tube vibrates perpendicular to the long axis. D is called the defect mode, which occurs when the tube/planar structure of graphene has defects. G is the tangential mode, the most intense feature of the material involving C-C vibration. G' is the second order of D. Interestingly, recovery of the fluorescence and spectral signatures was observed after pumping of the gas from the sample compartment (dotted grey trace, FIG. 2A).

The changes in D band intensity could be associated to the changes in conductance. Plots of conductance versus applied bias are constructed (FIG. 2B) from the I-V characteristics at various points of a semiconducting Au-mSWNT bundle labeled B1, shown in FIG. 1C. Such plots show a non-zero conductance at zero bias voltage upon exposure to hydrogen. This, along with the increased magnitude of the current indicates a transformation from semiconducting to metallic states of Au-mSWNT upon exposure to hydrogen (black traces in FIG. 2B). Several samples, besides all the other bundles of nanotubes (labeled B2-B4) shown in FIG. 1C, were investigated to confirm this effect. The conversion of the semiconducting Au-mSWNT composite to a metallic state in the presence of hydrogen was further confirmed by the G-band variation in the Raman spectra shown in FIG. 2C. The spectra were recorded at a resolution (2 cm-1) by dispersing the signal over an 1800 grooves/mm grating. This enabled tracking of the changes in the G-band of Au-mSWNT at the desired stages of the experiment. The G-band for pristine mSWNTs showed a FWHM of 54 cm-1 with an asymmetric line shape (FIG. 2C, trace (a)). This transformed to a G band line shape resembling semiconducting SWNTs for Au-mSWNT composite (FIG. 2C, trace (b), FWHM=21 cm-1). Upon exposure of 500 torr of H2 gas, an increase in the FWHM was observed and the spectrum resembled that of mSWNTs (FIG. 2C, trace (c), FWHM=54 cm-1). Note that the change in the electrical conductivity of the composite was completely reversible. On removing hydrogen from the sample compartment, the G-band was seen to revert to the semiconducting state (FIG. 2C, trace (d), FWHM=20 cm-1). It is to be noted that traces (b) to (d) were recorded from the same point in the sample. The changes were further confirmed by performing similar experiments at several areas across the sample.

Without limiting this invention to any particular phenomenon, it could be postulated that hydrogen runs into both the endohedral and the interstitial spaces of the bundles of nanotubes. However, nitrogen can occupy the endohedral spaces of the nanotubes. No significant changes in the intensities of the D-band or the G-band, or transformations in the conductance (FIG. 2B) were observed with nitrogen. The bundles of nanotubes were exposed to nitrogen at a pressure of 100 torr. In region I of FIG. 2D (dotted line, triangles), the intensity did not change upon exposure to nitrogen. Hydrogen was then leaked into the sample compartment so that it was at a partial pressure of 100 torr. The fluorescence intensity decreased (region II, triangles), showing that the interstitial H2 reduces the fluorescence intensity. In region III (triangles), 100 torr of the gas mixture was pumped away from the samples compartment, but there was no change in fluorescence intensity. Finally, the sample compartment was evacuated to a pressure of 10-2 torr, thereby removing the mixture of adsorbed gases. The fluorescence intensity was seen to regain to the original value (region IV, triangles). Additional experiments were also carried out reversing the order of exposure, i.e. hydrogen followed by nitrogen (dashed lines, squares in FIG. 2D). The fluorescence intensity decreased during hydrogen exposure (region I). This was in accordance with the earlier observation that interstitial hydrogen brings about a decrease in the fluorescence. Region II, where nitrogen was introduced after the exposure to the hydrogen, reflects no change in the fluorescence intensity. In region III, 100 torr of gas mixture was removed following which no significant change in the intensity was observed, indicating that the adsorbed H2 did not desorb. Similar to the earlier instance, complete removal of adsorbed gases recovered the fluorescence intensity to the original value (region IV).

The G' band, located close to the fluorescence maxima, normalized with respect to the baseline value is taken as a measure of I. The data suggest that the fluorescence intensity quenches rapidly with increasing ambient hydrogen pressure. Inset of FIG. 2A shows two regimes of linear dependence between intensity, I and reduced pressure, $$P^* = P\sigma / k_B T$$

(marked in the figure) with different slopes, k. The fluorescence intensity is proportional to the occupancy of the interstitial sites, I $\alpha\rho^*\exp(-E_a/k_BT)$ where $\rho^*$ is the dimensionless bulk gas density and $E_a$ is the activation energy for interstitial adsorption. Since $\rho^*\alpha P^*$, one gets a linear dependence, I=kP*, where the slope, $k\alpha\exp(-E_a/k_BT)$. Further measurements were carried to verify the temperature dependence of the slope. The activation energies were found to be 2 $k_BT$ and 4 $k_BT$, respectively corresponding to two different sites of adsorption which can affect the overall binding in the bundles of nanotubes according to the interstitial region and the outer surface of the bundles of nanotubes. The interstitial sites with the lower activation energy are occupied at lower P*. The second slope for higher pressure corresponds to higher activation energy due to the adsorption at the outer surface of the bundles of nanotubes.

Figure 3:
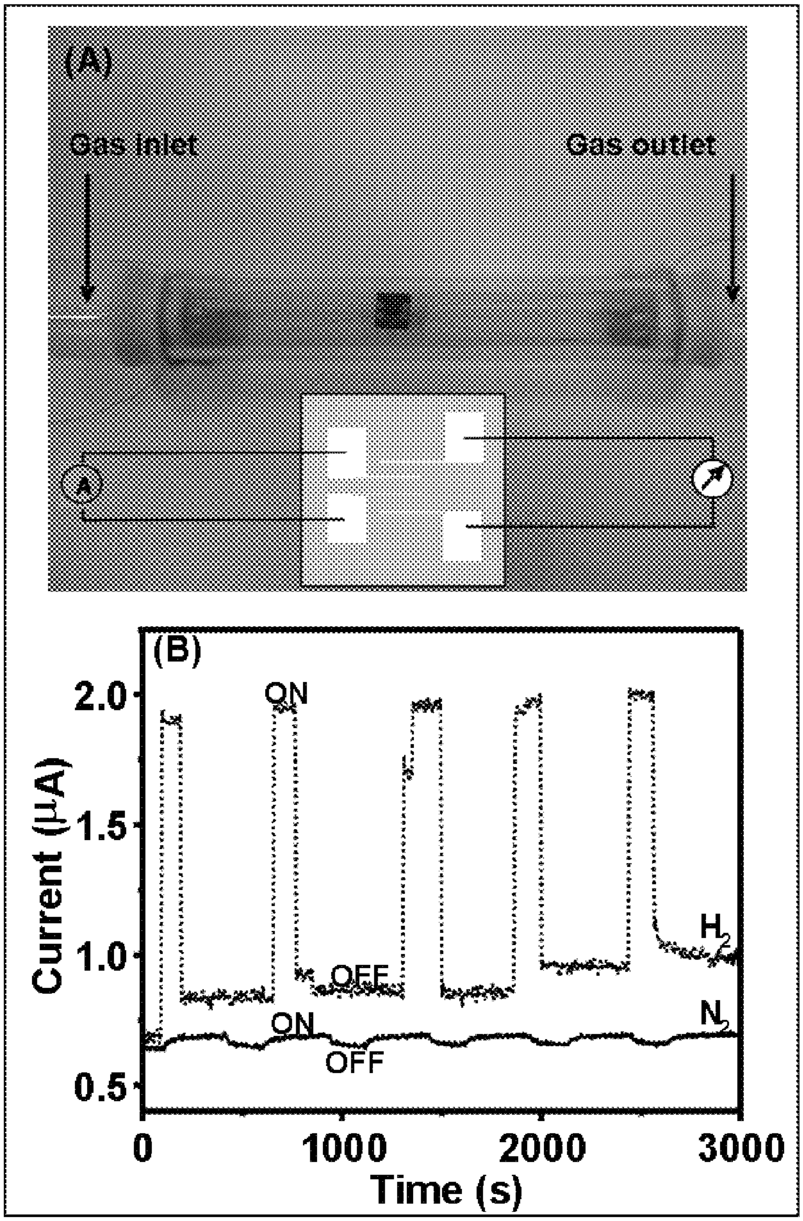
FIG. 3 (A) Photograph of an example device setup with a cartoon representation of the microelectrode. The shaded circle in the cartoon is used to represent the sample with the white regions representing the gold electrode. (B) A plot of variation of current for a bias voltage of 5 V for Au-mSWNT composite in presence of $H_2$ (500 torr, dotted black line) and $N_2$ (500 torr, black line). The ON and OFF states pertain to the presence and absence of gases, respectively. While the current for the ON state is constant, that due to the OFF state increases slowly with increase in cycles as hydrogen exposed during the previous cycle is not removed completely, consistent with the fluorescence data (FIG. 3A inset). Current measurements appear to be sensitive to tiny quantities of adsorbed gases.

A switching device, using the reversible change in the electrical conductivity of the composite upon gas adsorption, was fabricated on a silicon wafer by mask-assisted chemical vapor deposition of gold. Electrical leads were made onto gold pads using silver paste (SPI Supplies Inc.). The composite was placed on the electrodes so that electrical connections were made. The device was suspended in a cylindrical glass column sealed at both ends with a provision for flowing the desired gas. A photograph of the set-up and a schematic representation of the electrode are shown in FIG. 3A. The column was first evacuated using a rotary pump after which the desired gas ($H_2$ or $N_2$) was introduced into the compartment. The current response before and after the introduction of the gas at a constant voltage was monitored using a Keithley 2700 digital data acquisition system, interfaced to a computer. One cycle of gas exposure consists of evacuation of the chamber, introduction of the desired gas at the desired pressure, followed by pumping out of the gas. Several such cycles were carried out, with the current being monitored continuously. Plots of the variation of current with exposure of 500 torr of $H_2$ and $N_2$ are shown in FIG. 3B. This clearly shows an enhancement in the current response in case of $H_2$ (dotted black trace), which is not the case with $N_2$ (black trace). The magnitude of change in current for $H_2$ exposure, which is the signal from the device, is found to be as high as 150%. The quick response time of the device (~3 s) coupled with the huge signal, high selectivity towards $H_2$ and almost immediate recovery (~3 s) support commercial utility. Non-specific adsorption outside the bundles of nanotubes can lead to minor changes in current, as seen in the case of $N_2$. However, the magnitude of the response is insignificant compared to that obtained in the case of adsorption of $H_2$ in ICs.

The examples thus demonstrate that semiconducting nanotubes in Au-mSWNT bundles of nanotubes become metallic in the presence of gases in the interstitial region that interrupt the inter-tube van der Waals contacts. The occupation of the interstitial sites in such bundles of nanotubes results in quenching of its visible fluorescence due to nonradiative decay path offered by the metallic nanotubes. The pressure dependence of the quenching shows the energetics of the interstitial binding. The tunability of the electrical property has been used to fabricate a switch using the nanometer scale bundles of nanotubes. The examples further demonstrate how the electrical conductivity of Au-mSWNT bundle of nanotubes can be tuned for the fabrication of various nanoelectronic devices such as sensors, medical diagnostics and therapautics, chemical process control industry, nano-electronics, and nano devices.

In the detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein, and illustrated in the figures, can be arranged, substituted, combined, separated, and designed in a wide variety of different configurations, all of which are explicitly contemplated herein. The present disclosure is not to be limited in terms of the particular embodiments described in this application, which are intended as illustrations of various aspects. Many modifications and variations can be made without departing from its spirit and scope, as will be apparent to those skilled in the art. Functionally equivalent methods and apparatuses within the scope of the disclosure, in addition to those enumerated herein, will be apparent to those skilled in the art from the foregoing descriptions. Such modifications and variations are intended to fall within the scope of the appended claims. The present disclosure is to be limited only by the terms of the appended claims, along with the full scope of equivalents to which such claims are entitled. It is to be understood that this disclosure is not limited to particular methods, reagents, compounds compositions or biological systems, which can, of course, vary. It is also to be understood that the terminology used herein is for the purpose of describing particular embodiments only, and is not intended to be limiting. With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity. It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations. In addition, even if a specific number of an introduced claim recitation is explicitly recited, those skilled in the art will recognize that such recitation should be interpreted to mean at least the recited number (e.g., the bare recitation of "two recitations," without other modifiers, means at least two recitations, or two or more recitations). Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B." In addition, where features or aspects of the disclosure are described in terms of Markush groups, those skilled in the art will recognize that the disclosure is also thereby described in terms of any individual member or subgroup of members of the Markush group. As will be understood by one skilled in the art, for any and all purposes, such as in terms of providing a written description, all ranges disclosed herein also encompass any and all possible subranges and combinations of subranges thereof. Any listed range can be easily recognized as sufficiently describing and enabling the same range being broken down into at least equal halves, thirds, quarters, fifths, tenths, etc. As a non-limiting example, each range discussed herein can be readily broken down into a lower third, middle third and upper third, etc. As will also be understood by one skilled in the art all language such as "up to," "at least," "greater than," "less than," and the like include the number recited and refer to ranges which can be subsequently broken down into subranges as discussed above. Finally, as will be understood by one skilled in the art, a range includes each individual member. Thus, for example, a group having 1-3 cells refers to groups having 1, 2, or 3 cells. Similarly, a group having 1-5 cells refers to groups having 1, 2, 3, 4, or 5 cells, and so forth. While various aspects and embodiments have been disclosed herein, other aspects and embodiments will be apparent to those skilled in the art. The various aspects and embodiments disclosed herein are for purposes of illustration and are not intended to be limiting, with the true scope and spirit being indicated by the following claims.

The invention claimed is:

1. A method comprising:

providing a semiconducting composite comprising single-walled carbon nanotubes and metal nanoparticles comprising a noble metal;

adsorbing a gas to the semiconducting composite to form a metallic composite, wherein the gas comprises hydrogen gas or helium gas;

applying a voltage to the metallic composite such that a first electrical current flows in the metallic composite;

desorbing the gas from the metallic composite to form the semiconducting composite; and applying about the same voltage to the semiconducting composite such that a second electrical current flows in the semiconducting composite wherein the first electrical current is greater than the second electrical current.

2. The method of claim 1, wherein the gas comprises hydrogen gas.

3. The method of claim 2, wherein adsorbing the gas to the semiconducting composite to form the metallic composite comprises exposing the composite to a partial pressure of the hydrogen gas of at least about 100 torr.

4. The method of claim 1, wherein the gas comprises helium gas.

5. The method of claim 1, wherein the noble metal comprises at least one of gold or silver.

6. The method of claim 1, wherein the metal nanoparticles have an average diameter from about 1 nm to about 100 nm.

7. The method of claim 1, wherein desorbing the gas from the metallic composite to form the semiconducting composite comprises applying a vacuum to the metallic composite.

8. The method of claim 7, wherein applying the vacuum comprises applying a pressure of about $10^{-2}$ torr.

9. The method of claim 1, wherein the semiconducting composite is disposed on a silicon wafer.

10. The method of claim 9, wherein the semiconducting composite is electrically coupled to a pair of conductive pads on opposing sides of the semiconducting composite.

11. The method of claim 10, wherein applying the voltage to the metallic composite such that the first electrical current across the metallic composite comprises applying the voltage to the pair of conductive pads.

12. The method of claim 1, wherein the semiconducting composite is disposed in a sealed chamber.

13. A method comprising:

providing a semiconducting composite comprising single-walled carbon nanotubes and metal nanoparticles comprising a noble metal;

adsorbing an amount of gas into the semiconducting composite to form a metallic composite, wherein the amount of gas adsorbed into the composite is effective to reversibly change an electrical property of the composite from a semiconducting property to a metallic property;

applying a voltage to the metallic composite;

desorbing the gas from the metallic composite to form a semiconducting composite; and applying a voltage to the semiconducting composite.

14. The method of claim 13, wherein the gas is configured to adsorb within interstitial channels between the single-walled carbon nanotubes in the composite.

15. The method of claim 14, wherein the gas comprises hydrogen gas.

16. The method of claim 13, wherein the semiconducting composite is disposed on a silicon wafer.

17. The method of claim 13, wherein the semiconducting composite is electrically coupled to a pair of conductive pads on opposing sides of the semiconducting composite.

18. The method of claim 13, wherein the semiconducting composite is disposed in a sealed chamber.

19. The method of claim 13, wherein the noble metal is gold.

20. The method of claim 13, wherein the noble metal is silver.

* * * * *

UNITED STATES PATENT AND TRADEMARK OFFICE

CERTIFICATE OF CORRECTION

PATENT NO. : 8,519,489 B2
APPLICATION NO. : 12/638167
DATED : August 27, 2013
INVENTOR(S) : Thalappil et al.

It is certified that error appears in the above-identified patent and that said Letters Patent is hereby corrected as shown below:

On the Title Page, in Item (56), under "OTHER PUBLICATIONS", in Column 2, Line 4, delete "Transistion" and insert -- Transition --, therefor.

In the Specification

In Column 4, Line 65, delete "kB" and insert -- $k_B$ --, therefor.

In Column 6, Line 20, delete "tri junction" and insert -- tri-junction --, therefor.

In Column 9, Lines 28-29, delete "therapautics," and insert -- therapeutics, --, therefor.

In the Claims

In Column 11, Line 27, in Claim 1, delete "composite" and insert -- composite, --, therefor.

Signed and Sealed this
Twelfth Day of November, 2013

Teresa Stanek Rea
*Deputy Director of the United States Patent and Trademark Office*